(12) United States Patent
Gao et al.

(10) Patent No.: US 7,477,490 B2
(45) Date of Patent: Jan. 13, 2009

(54) SINGLE SENSOR ELEMENT THAT IS NATURALLY DIFFERENTIATED

(75) Inventors: Kaizhong Gao, Bloomington, MN (US);
Jian X. Shen, Savage, MN (US);
Shaoping Li, Naperville, IL (US); Song S. Xue, Edina, MN (US); Juan J. Fernandez-de-Castro, Lakeville, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 394 days.

(21) Appl. No.: 10/883,065

(22) Filed: Jun. 30, 2004

(65) Prior Publication Data

US 2006/0002035 A1 Jan. 5, 2006

(51) Int. Cl.
*G11B 5/33* (2006.01)
(52) U.S. Cl. .................................................. 360/324.1
(58) Field of Classification Search ............... 360/324.1, 360/324.11, 324.2, 317, 314, 313
See application file for complete search history.

(56) References Cited

U.S. PATENT DOCUMENTS

| | | | | |
|---|---|---|---|---|
| 4,356,523 A | 10/1982 | Yeh | | 360/113 |
| 4,589,041 A | 5/1986 | Voegeli | | 360/113 |
| 4,703,378 A * | 10/1987 | Imakoshi et al. | | 360/66 |
| 4,949,039 A * | 8/1990 | Grunberg | | 324/252 |
| 5,073,836 A | 12/1991 | Gill et al. | | 360/113 |
| 5,527,626 A * | 6/1996 | Gijs et al. | | 428/611 |
| 5,636,093 A * | 6/1997 | Gijs et al. | | 360/126 |
| 5,695,864 A * | 12/1997 | Slonczewski | | 428/212 |
| 5,734,532 A * | 3/1998 | Kobayashi et al. | | 360/316 |
| 5,751,521 A | 5/1998 | Gill | | 360/113 |
| 5,764,567 A * | 6/1998 | Parkin | | 365/173 |
| 5,828,525 A | 10/1998 | Iwasaki et al. | | 360/113 |
| 5,953,248 A * | 9/1999 | Chen et al. | | 365/158 |
| 5,986,858 A * | 11/1999 | Sato et al. | | 360/324.2 |
| 6,205,008 B1 * | 3/2001 | Gijs et al. | | 360/324 |
| 6,259,586 B1 * | 7/2001 | Gill | | 360/324.2 |
| 6,275,363 B1 * | 8/2001 | Gill | | 360/324.2 |
| 6,392,849 B2 | 5/2002 | Maruyama et al. | | 360/314 |
| 6,462,541 B1 | 10/2002 | Wang et al. | | 324/252 |
| 6,466,419 B1 * | 10/2002 | Mao | | 360/324.12 |
| 6,473,279 B2 * | 10/2002 | Smith et al. | | 360/324.12 |
| 6,483,673 B1 | 11/2002 | Iwasaki et al. | | 360/324.11 |
| 6,556,388 B1 * | 4/2003 | Everitt et al. | | 360/314 |
| 6,621,664 B1 | 9/2003 | Trindade et al. | | 360/118 |
| 6,636,391 B2 * | 10/2003 | Watanabe et al. | | 360/321 |
| 6,643,103 B1 | 11/2003 | Trindade | | 360/314 |
| 6,657,823 B2 * | 12/2003 | Kawato | | 360/314 |
| 6,667,861 B2 | 12/2003 | Gill | | 360/314 |
| 6,750,068 B2 * | 6/2004 | Chen | | 438/3 |
| 6,807,034 B2 * | 10/2004 | Hasegawa et al. | | 360/324.2 |
| 6,865,109 B2 * | 3/2005 | Covington | | 365/173 |
| 6,906,898 B2 * | 6/2005 | Kawato | | 360/314 |
| 6,914,759 B2 * | 7/2005 | Chen et al. | | 360/324 |
| 6,927,948 B2 * | 8/2005 | Gill | | 360/314 |
| 7,005,691 B2 * | 2/2006 | Odagawa et al. | | 257/295 |

(Continued)

FOREIGN PATENT DOCUMENTS

JP 2000340859 * 12/2000

*Primary Examiner*—Angel A. Castro

(57) ABSTRACT

A differentiated sensor includes a pair of magnetic layers having magnetization directions that are substantially antiparallel in a quiescent state. At least one of the magnetic layers is a free layer. A spacer layer is disposed between the pair of magnetic layers.

18 Claims, 4 Drawing Sheets

U.S. PATENT DOCUMENTS

| | | | |
|---|---|---|---|
| 7,035,059 B2 * | 4/2006 | Gill | 360/324.11 |
| 7,042,686 B2 * | 5/2006 | Hiramoto et al. | 360/324.2 |
| 7,057,865 B1 * | 6/2006 | Mao et al. | 360/324.2 |
| 7,064,934 B2 * | 6/2006 | Mao et al. | 360/313 |
| 7,110,287 B2 * | 9/2006 | Huai et al. | 365/171 |
| 7,171,741 B2 * | 2/2007 | Gill | 29/603.14 |
| 7,196,882 B2 * | 3/2007 | Deak | 360/324.2 |
| 2002/0034056 A1 | 3/2002 | Chen et al. | |
| 2002/0044389 A1 | 4/2002 | Seigler et al. | |
| 2002/0064004 A1 * | 5/2002 | Worledge | 360/324.2 |
| 2002/0075608 A1 | 6/2002 | Kawato | |
| 2002/0135954 A1 | 9/2002 | Yoshikawa et al. | |
| 2003/0197966 A1 * | 10/2003 | Yamazaki et al. | 360/67 |
| 2005/0068683 A1 * | 3/2005 | Gill | 360/314 |
| 2005/0128651 A1 * | 6/2005 | Yi et al. | 360/324.1 |
| 2005/0270702 A1 * | 12/2005 | Komagaki et al. | 360/319 |

* cited by examiner

SINGLE SENSOR ELEMENT THAT IS NATURALLY DIFFERENTIATED

BACKGROUND OF THE INVENTION

The present invention relates generally to the field of magnetic data storage and retrieval systems. More particularly, the present invention relates to a naturally differentiated magnetoresistive sensor.

In a magnetic data storage and retrieval system, a magnetic recording head typically includes a reader portion having a magnetoresistive (MR) sensor or reader for retrieving magnetically encoded information on a magnetic storage medium, such as a magnetic disc. Magnetic flux from the surface of the disc causes rotation of a magnetization vector of a sensing layer or layers of the MR sensor, which in turn causes a change in electrical resistive of the MR sensor. The sensing layers are often called "free" layers, because the magnetization vectors of the sensing layers rotate in response to external magnetic flux. A change in resistance of the MR sensor can be detected by passing a sense current, which is a fixed direct current (DC), through the MR sensor and measuring a DC voltage change across the MR sensor. External circuitry then converts the voltage information into an appropriate format and manipulates that information as necessary to recover the information encoded on the magnetic storage medium.

MR sensors have been developed that can be characterized in three general categories: (1) Anisotropic Magnetoresistive (AMR) sensors, (2) Giant Magnetoresistive (GMR) sensors, including Spin Valve sensors and multi-layer GMR sensors, and (3) Tunneling Magneto Resistive (TMR) sensors (also known as Tunneling Giant Magnetoresistive sensors).

AMR sensors generally have a single MR layer formed of a ferromagnetic material. The resistance of the MR layer varies as a function of $\cos^2 \alpha$, where $\alpha$ is the angle formed between the magnetization vector of the MR layer and the direction of the sense current flowing in the MR layer.

GMR sensors have a series of alternating magnetic and non-magnetic layers. The resistance of GMR sensors varies as a function of the spin-dependent transmission of conduction electrons between the magnetic layers separated by a non-magnetic layer and in the accompanying spin-dependent scattering, which takes place at the interface of the magnetic and non-magnetic layers and within the magnetic layers. The resistance of a GMR sensor depends upon the relative orientations of the magnetization vectors in consecutive magnetic layers, and varies as the cosine of the angle between the magnetization vectors of consecutive magnetic layers.

TMR sensors have a configuration similar to GMR sensors, except that the magnetic layers of the sensor are separated by an insulating non-magnetic film thin enough to allow electron tunneling between the magnetic layers. The tunneling probability of an electron incident on the barrier of one magnetic layer depends upon the character of the electrode wave function and the spin of the electron relative to the magnetization direction in the other magnetic layer. As a consequence, the resistance of the TMR sensor depends upon the relative orientations of the magnetization of the magnetic layers, exhibiting a minimum for a configuration in which the magnetizations of the magnetic layers are parallel, and at a maximum for a configuration in which the magnetizations of the magnetic layers are antiparallel.

For all types of MR sensors, magnetization rotation occurs in the sensing layers in response to magnetic flux from the magnetic storage medium (e.g., the magnetic disc). As the recording density of magnetic discs continues to increase, the width of the data tracks on the discs must decrease, which necessitates correspondingly smaller and smaller MR sensors. As MR sensors become smaller in size, particularly for sensors with dimensions less than about 0.1 micrometers ($\mu m$), the sensors have the potential to exhibit an undesirable magnetic response to applied fields from the magnetic disc. MR sensors must be designed in such a manner that even small sensors provide a signal with adequate voltage amplitude and minimal noise interference (e.g., media noise and electronic noise). This requires the signal-to-noise (SNR) ratio to be sufficiently high for accurate recovery of the data on the disc.

With longitudinal recording, the magnetic medium includes a plurality of bits, each bit having a magnetization direction arranged parallel to an air bearing surface (ABS) of the transducing head. In traditional longitudinal recording, a generally bell-shaped waveform is generated as the longitudinal reader crosses a single transition on the magnetic medium (i.e., where magnetization of the bits changes polarity). This bell-shaped curve has a minimum voltage ($V_0$) when the reader is positioned over a portion of the magnetic medium having substantially constant magnetization, and has a relative maximum or peak voltage ($V_1$) as the reader crosses a transition. Readers detect variations in magnitude of the playback voltage for reading data from the magnetic medium.

With perpendicular recording, magnetization directions of individual bits on the magnetic medium are arranged orthogonal to an air bearing surface of the transducing head. With traditional perpendicular recording (i.e., non-differentiated perpendicular recording), a playback waveform is generated such that playback voltage has a magnitude of approximately zero when the reader crosses a transition on the magnetic medium, and reaches a positive or negative maximum voltage ($V_1$) when the transducing head is positioned over a region of the magnetic medium having a substantially constant magnetization direction. The playback waveform generated with traditional perpendicular recording is not bell-shaped. In order to produce a bell-shaped playback waveform similar to that produced with longitudinal recording, differentiated readers are required for perpendicular recording.

Generally, a differentiated reader is defined as a reader that dynamically detects a difference in magnetization directions of magnetic layers having magnetization directions capable of some rotation, by measuring a change in resistance of the reader. Differentiated readers typically include two separate reader or sensor elements physically separated by a gap film (i.e., a film located in a reader gap that separates other layers). A reader element is a component, typically comprised of a plurality of layers, generally capable of producing a MR or GMR effect for reading magnetically stored data. The equilibrium magnetization directions of the respective free layers of each reader element are typically influenced by an external magnetic field in a quiescent state. The two reader elements are typically arranged such that one reader element encounters a transition on a corresponding magnetic medium before the other reader element. A generally bell-shaped playback waveform is achieved by adding (or subtracting) the signals from both the reader elements of the differentiated reader. In that way, differentiated readers detect field variations for reading data from the magnetic medium. However, known differentiated perpendicular transducing heads produce a playback waveform that has a smaller amplitude than playback waveforms typical of longitudinal recording.

Differentiated readers exhibit a significant reduction in playback voltage as compared to longitudinal systems. For example, the zero-to-peak voltage change in the playback waveform for longitudinal recording is about 1-2 microvolts (μV). In contrast, known differentiated reader systems typically have a playback voltage of about one tenth (1/10) or less of the magnitude of known longitudinal playback systems. This is problematic in that it is desired to achieve a relatively high signal-to-noise ratio (SNR) with the playback signal. For example, assuming noise remains constant, a 50% reduction in playback voltage amplitude corresponds to reduction in the SNR of about 6 decibels (dB).

Another problem with known designs is that due to a voltage dropoff as the reader is positioned over interior portions of a large DC region of a magnetic medium (i.e., a region having a constant magnetization direction), read errors may occur. Such read errors occur when the reader mistakes decreased voltage in the DC region for a transition (i.e., a change in polarity of the magnetization of bits on the magnetic medium).

Both theory and simulation show that to achieve the same playback amplitude in differentiated perpendicular heads as compared to longitudinal heads, the differentiated perpendicular designs with two or more separate read elements must have sensor spacing equal to or larger than the pulse width at half maximum ($PW_{50}$) for the playback waveform. $PW_{50}$ is given by the following equation, where "g" represents reader shield-to-shield spacing, "d" represents fly height or head-to-media separation, "a" represents a transition parameter, and "δ" represents media thickness:

$$PW_{50} = \sqrt{g^2 + 4(d+a)(d+a+\delta)}$$

However, because $PW_{50}$ is always larger than shield-to-shield spacing, it is not possible to design a differentiated reader with two separate reader elements and adequate playback amplitude.

Because of the high costs associated with specialized circuitry for performing differentiation calculations, it is desirable to use circuitry common in the art for interpreting signals from an MR sensor.

Thus, the present invention relates to a naturally differentiated reader for perpendicular transducing heads having a playback waveform with an amplitude comparable to that for longitudinal recording.

BRIEF SUMMARY OF THE INVENTION

The present invention relates to a differentiated sensor that includes a pair of magnetic layers having magnetization directions that are substantially antiparallel in a quiescent state. At least one of the magnetic layers is a free layer. A spacer layer is disposed between the pair of magnetic layers.

The present invention also relates to a method of differential waveform playback for use with a sensor having a plurality of layers, the method includes providing a sensor having two free layers arranged in any direction such that the magnetization directions of the two free layers assume a substantially antiparallel orientation without requiring the application of an external magnetic field. The method also includes detecting changes in a resistance of the sensor, measured as a function of an angle between the magnetization directions of the two free layers according to a magnetic field being sensed.

DETAILED DESCRIPTION

The present invention relates to a naturally differentiated transducing head sensor. The sensor includes a single sensor element having a pair of free layers with magnetization directions that are naturally antiparallel in a quiescent (or equilibrium) state. In operation, the naturally differentiated sensor element permits dynamic detection of a difference between the magnetization directions of the free layers, where resistance of the sensor element reaches a relative maximum above a transition on the magnetic storage medium. A playback waveform is capable of being generated, where the waveform resembles that for longitudinal recording and playback data systems.

Generally, magnetization directions of any magnetic layers (e.g., free layers) are arranged "naturally" where those magnetization directions are substantially arranged without requiring the application of an external biasing force, e.g. a permanent magnetic layer.

A "quiescent state" is an operational state achieved when the sensor element is positioned, for example, above a single transition on a magnetic medium, where the net magnetic field exerted upon the sensor element has a magnitude of approximately zero. The quiescent state refers to an operational state where magnetic fields external to the transducer are not applied (or have a net magnitude of zero), though biasing fields necessary for operation of the transducer (i.e., biasing fields internal to the transducer) can be present.

Figure 1:
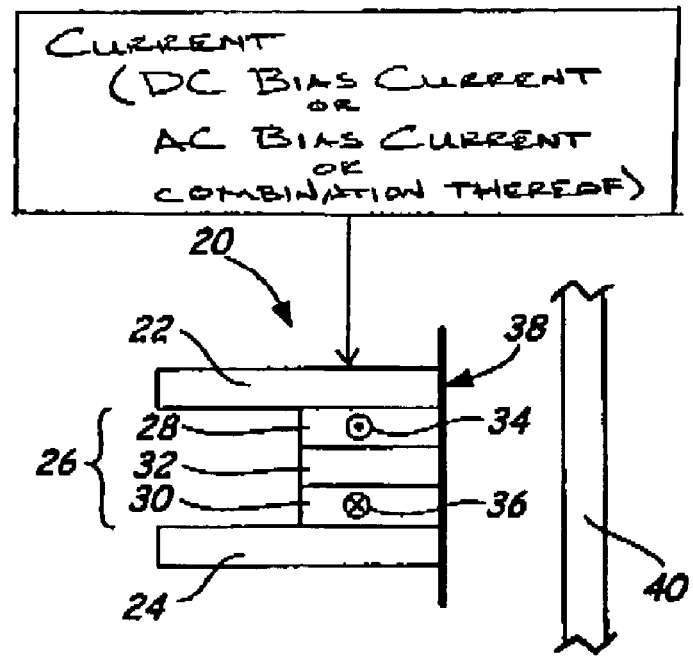
FIG. 1 is an exemplary representation of a naturally differentiated current perpendicular-to-plane sensor, which is a portion of a transducing head.

FIG. 1 is an exemplary representation of a naturally differentiated current perpendicular-to-plane (CPP) sensor, which is a portion of a transducer 20. This transducer 20 includes a pair of electrodes or leads 22 and 24, and a differential magnetoresistive (MR) sensor element 26 (synonymously called a MR reader element). A sensor element is a component, typically comprised of a plurality of layers, generally capable of producing a MR or GMR effect for reading magnetically stored data. Sensor element 26 includes a pair of free layers 28 and 30 and a non-magnetic spacer layer 32. Free layer 28 has a magnetization direction 34, and free layer 30 has a magnetization direction 36. Free layers 28 and 30 are generally formed of a ferromagnetic material. Transducer 20 includes an air bearing surface (ABS) 38 relative a magnetic storage medium, such as a disc 40. Transducer 20 may further include other features or layers common in the art, which are not shown in the simplified representation in FIG. 1 for clarity. Moreover, elements shown in FIG. 1 are representational, and could take other shapes and sizes.

Sensor element 26 is disposed between the pair of leads 22 and 24, which may also function as shields. Spacer layer 32 is disposed between free layers 28 and 30. Free layer 28 has a magnetization direction 34 that is substantially antiparallel to magnetization direction 36 of free layer 30 in a quiescent state. Sensor element 26 maybe any type of CPP sensor, including giant magnetoresistive (GMR) sensors, such as Spin Valve or tunneling types. With a Spin Valve embodiment, spacer layer 32 is formed of a non-magnetic, conductive material, which is typically metallic. For example, spacer layer 32 in a Spin Valve embodiment may be formed of Cu, Ag, Au, or Ru. Where sensor element 26 is a tunneling type, spacer layer 32 is a barrier layer formed of a non-magnetic, insulative or semi-conductive material, such as oxides formed of Al, Zr, Ht, or Ti. In either a Spin Valve or tunneling embodiment, sensor element 26 can be configured as a tri-layer sensor element (i.e., having two free layers, a spacer layer and one bias field, without a reference layer). Moreover, transducer 20 can include a read sensor characterized as another type, such as an embodiment that is a mixture of both Spin Valve and tunneling type sensor elements.

The magnetization directions 34 and 36 of free layers 28 and 30 are antiparallel in a quiescent state. Nearly any orientation of magnetization directions 34 and 36 is possible, so long as magnetization 34 and 36 are antiparallel in a quiescent state. The antiparallel arrangements of magnetization directions 34 and 36 of free layers 28 and 30 can be achieved naturally, by magnetostatic coupling, or by exchange coupling. Magnetization directions 34 and 36 of free layers 28 and 30 are permitted to rotate according to an applied magnetic field, such as localized magnetic fields on magnetic storage medium 40.

While the orientation of magnetization directions 34 and 36 can be nearly any orientation with respect to magnetic medium 40, magnetization directions 34 and 36 are typically not orthogonal to magnetic medium 40 in a quiescent state. Moreover, while nearly any orientation of magnetization directions 34 and 36 is possible, the orientations are typically arranged such that magnetization directions 34 and 36 in a quiescent state are aligned substantially parallel to an air bearing surface (ABS) of transducer 20. Such alignment may be due to shape anisotropy. Such alignment can also be due to additional coupling provided by, for example, magnetic coupling from spacer layer 32.

In operation, a sense current is passed between leads 22 and 24, which also function as electrodes. The sense current can be characterized as a direct current (DC) bias current, an alternating current (AC) bias current, or a current with a combination of DC and AC bias components. Those skilled in the art will recognize that changes may be made to external circuitry, such as to a pre-amp, in order to provide a particular kind of biasing current. However, functioning of sensor element 26 is generally the same, regardless of the characteristics of the sense current. As magnetization directions 34 and 36 rotate according to localized magnetic fields on magnetic medium 40, resistance of sensor element 26 changes as a function of an angle between magnetization directions 34 and 36. Resistance of sensor element 26 is at a relative maximum when sensor element 26 is in a quiescent state (i.e., with no applied external magnetic field) and magnetization directions 34 and 36 are substantially antiparallel. A voltage, which is representative of the sense current multiplied by the resistance of sensor element 26 (i.e, following the equation V=IR), can be measured by external circuitry (not shown), of a type well-known in the art, in order to detect the changes in resistance of sensor element 26.

Localized magnetic fields on magnetic medium 40 will cause magnetization directions 34 and 36 of free layers 28 and 30 to rotate, thereby decreasing the angle formed between magnetization directions 34 and 36 from about 180° (i.e., a substantially antiparallel orientation) in a quiescent state.

Magnetization directions 34 and 36 of free layers 28 and 30 will be arranged in an antiparallel configuration. The antiparallel configuration can be obtained naturally (e.g., no permanent magnetic layer or other biasing layer), by magnetostatic coupling, or by exchange coupling. FIG. 1 illustrates a naturally differentiated sensor because it does not require permanent magnetic layers or other biasing layers to establish magnetization directions 34 and 36 of free layers 28 and 30. However, such biasing can be provided to achieve optimal performance.

Figure 2:
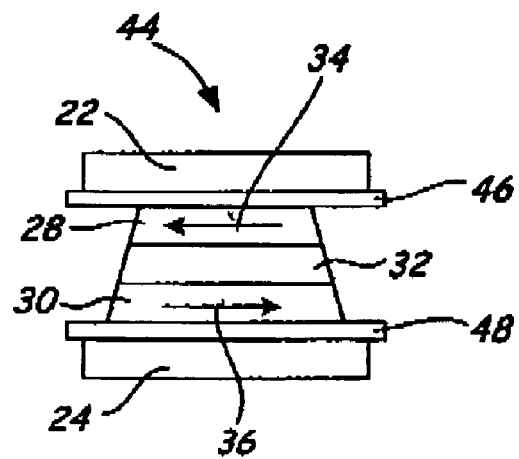
FIG. 2 is an exemplary air bearing surface view of a naturally differentiated current perpendicular-to-plane sensor, which is a portion of a transducing head.

FIG. 2 is an exemplary air bearing surface (ABS) view of a differentiated current perpendicular-to-plane (CPP) sensor, which is a portion of a transducer 44. FIG. 2 illustrates the portion of transducer 44 in a quiescent state. transducer 44 is similar to transducer 20 shown in FIG. 1, and further includes a pair of inter-layers 46 and 48. Inter-layers 46 and 48 are disposed on opposing sides of sensor element 26 and between leads 22 and 24. Inter-layers 46 and 48 function as spacer layers, whose thickness may be adjusted as needed. Inter-layers 46 and 48 may be formed of, for example, Ru or Cu.

Figure 3:
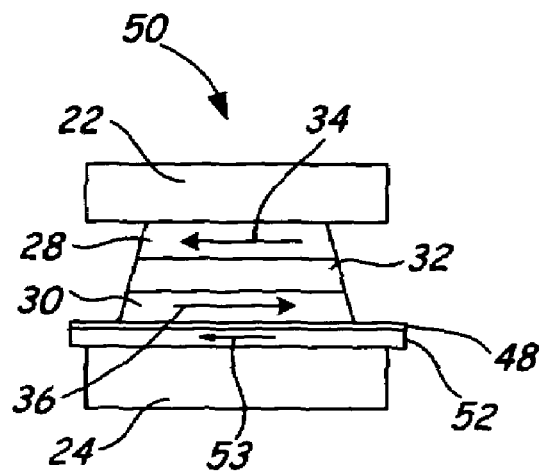
FIG. 3 is an exemplary air bearing surface view of a naturally differentiated current perpendicular-to-plane sensor, which is a portion of a transducing head.

FIG. 3 is an exemplary ABS view of a differentiated current perpendicular-to-plane (CPP) sensor, which is a portion of a transducer 50. Transducer 50 includes a layer 52, such as a set layer, having an equilibrium magnetization direction 53. A set layer is a magnetic layer whose magnetization direction is permitted to rotate over a relatively small range. The range over which the magnetization direction of a set layer rotates is generally established through exchange biasing, magnetostatic coupling, or other forms of magnetic coupling. Set layer 52 is located between inter-layer 48 and lead 24. Set layer 52 may be located elsewhere, such as between free layer 28 and lead 22. Set layer 52 is formed of ferromagnetic material.

Set layer 52 has an equilibrium magnetization direction orientated generally antiparallel to the magnetization direction of the nearest free layer, which is magnetization direction 36 of free layer 30 in the embodiment shown in FIG. 3. The particular orientation of the equilibrium magnetization direction of set layer 52 may be in any direction. In further embodiments, set layer 52 may be weakly pinned by an anti-ferromagnetic layer or permanent magnet layer (not shown) located adjacent set layer 52, such as between set layer 52 and lead 24.

Set layer 52 functions to provide control over rotation of magnetization directions of free layers 28 and 30. Because a shallow energy surface curve for rotation of the magnetization directions of free layers 28 and 30 is undesirable, set layer 52 allows some control over rotation of magnetization directions 34 and 36 of free layers 28 and 30 (e.g., set layer 52 allows some limitations on the rotational ranges of magnetization directions 34 and 36). Set layer 52 allows optimization of an energy surface for free layers 28 and 30. Therefore, set layer 52 decreases the likelihood that magnetization directions of free layers 28 and 30 will "jump", where a "jump" indicates that the magnetization directions of free layers 28 and 30 substantially change orientations without passing a transition on the associated magnetic medium, thereby creating interference and read errors.

However, in this embodiment set layer 52 is distinguishable from pinned or reference layers in transducing head designs. Set layer 52, shown in FIG. 3, is not used as a reference layer for measuring an angle between magnetization directions 34 and 36 of free layers 28 and 30 and the corresponding reference layer. Moreover, magnetization direction 53 of set layer 52 need not be strongly pinned. Some rotation of the magnetization direction of set layer 52 may be permitted.

Layer 52 can be used as a pinned or reference layer. In that case, magnetization direction 53 can be substantially fixed.

Figure 4:
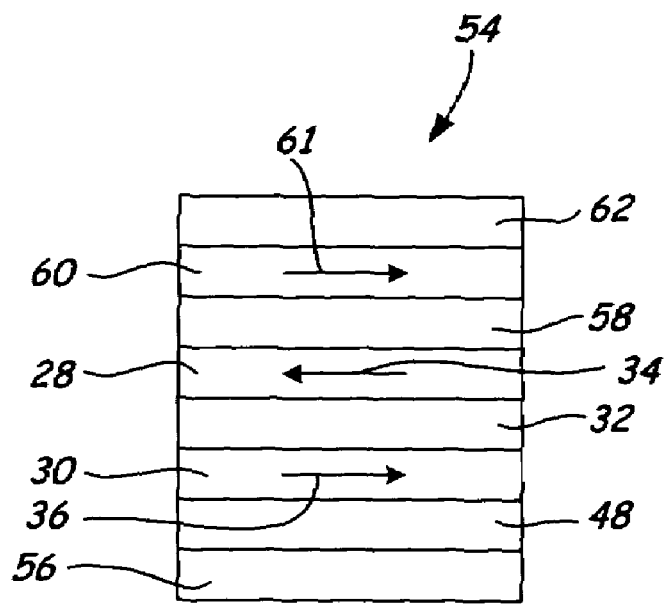
FIG. 4 is an exemplary representation of a sensor element stack.

FIG. 4 is an exemplary representation of a sensor element stack 54. Sensor element stack 54 includes free layers 28 and 30, spacer layer 32, and inter-layer 48, similar to that shown in FIG. 3. Sensor element stack further includes a seed layer 56, a spacer layer 58, a coupling layer 60, and a cap layer 62. Sensor element stack 54 functions similarly to the embodiments shown and described above.

Coupling layer 60 can be a set layer, a pinned layer, or other type of ferromagnetic or anti-ferromagnetic layer. For example, coupling layer 60 may be composed of PtMn, InMn, or PtMnPd. A location of coupling layer 60 can change relative to other layers of sensor element stack 54. For example, coupling layer 60 can be located between free layer 30 and seed layer 56. Those skilled in the art will recognize that coupling layer 60 can be utilized for providing, for example, magnetic coupling between other layers in sensor element stack 54.

Those skilled in the art will recognize that free layers 28 and 30 are formed with sufficient thickness such that changes in resistances of the free layers are detectable as sensor element stack 54 detects external magnetic fields from a magnetic medium, such as a magnetic disc (not shown).

Figure 5:
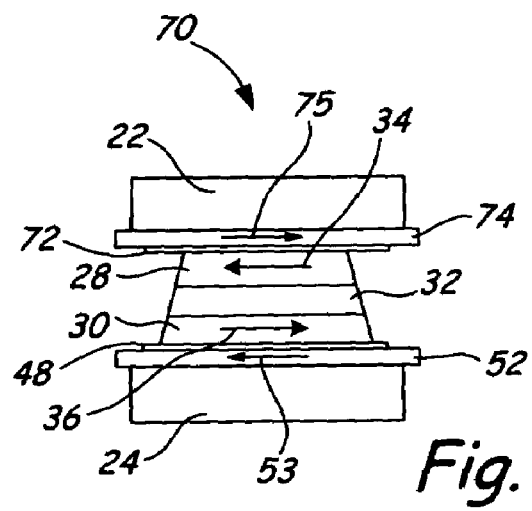
FIG. 5 is an exemplary air bearing surface view of a naturally differentiated current perpendicular-to-plane sensor, which is a portion of a transducing head.

FIG. 5 is an exemplary ABS view of a differentiated current perpendicular-to-plane (CPP) sensor, which is a portion of a transducer 70, Transducer 70 is siniliar to that shown in FIG. 3, and further includes another inter-layer 72 and another set layer 74. Transducer 70 is arranged such that inter-layer 72 and set layer 74 are adjacent lead 22, and inter-layer 48 and set layer 52 are adjacent lead 24. Set layer 74 has a magnetization direction 75 orientated generally antiparallel to magnetization direction 53 of set layer 52.

Figure 6:
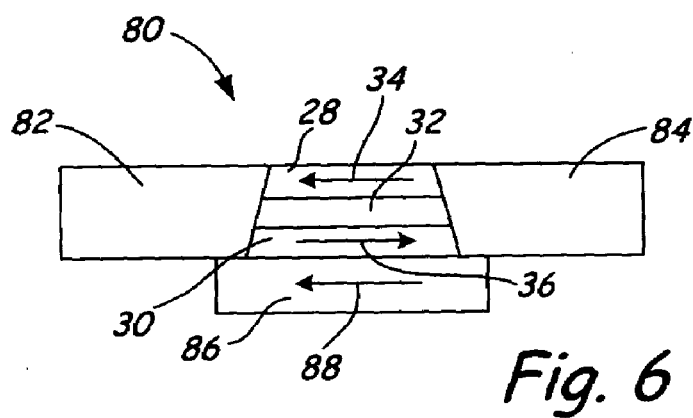
FIG. 6 is an exemplary air bearing surface view of a naturally differentiated current-in-plane sensor, which is a portion of a transducing head.

FIG. 6 is an exemplary ABS view of a differentiated current-in-plane (CIP) sensor, which is a portion of a transducer 80. Transducer 80 includes free layers 28 and 30, spacer layer 32, a pair of electrodes 82 and 84, and a set layer 86. Set layer 86 has an equilibrium magnetization direction 53 generally antiparallel to magnetization direction 36 of free layer 30.

Transducer 80 operates by passing a sense current between electrodes 82 and 84 in a direction in-plane with the free layers 28 and 30. A location of set layer 86 can be adjacent free layer 28.

Figure 7:
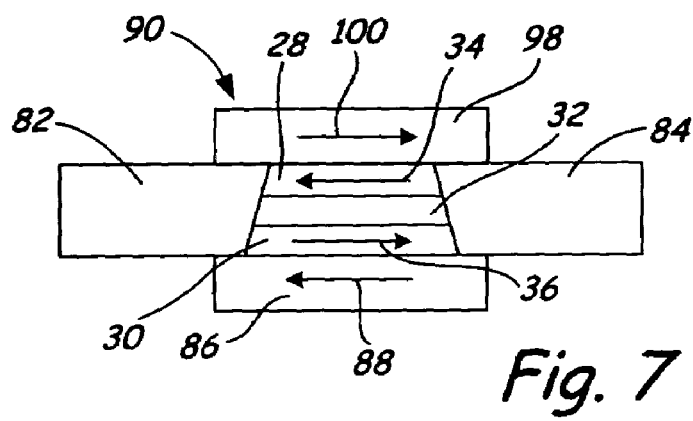
FIG. 7 is an exemplary air bearing surface view of a naturally differentiated current-in-plane sensor, which is a portion of a transducing head.

FIG. 7 is an exemplary ABS view of a differentiated current-in-plane (CIP) sensor, which is a portion of a transducer 90. This embodiment is similar to that shown in FIG. 6, and further includes another set layer 98. Set layer 98 has an equilibrium magnetization direction 100 established generally antiparallel to the magnetization direction of set layer 86.

Figure 8A:
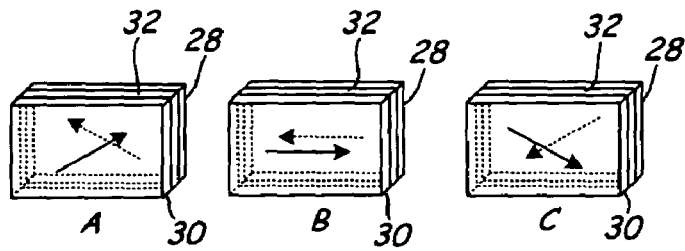
FIG. 8A is an exemplary representation of the magnetization directions of free layers of a naturally differentiated sensor element in three positions as the sensor element crosses a single transition on a corresponding magnetic medium.
Figure 8B:
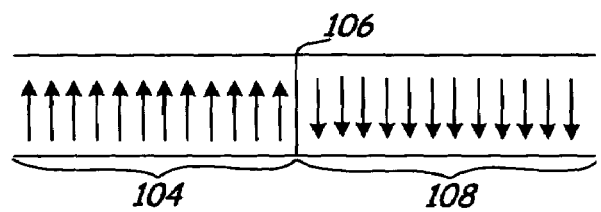
FIG. 8B is an exemplary representation of a portion of a magnetic medium exhibiting a single transition in the magnetization directions of a series of bits.
Figure 8C:
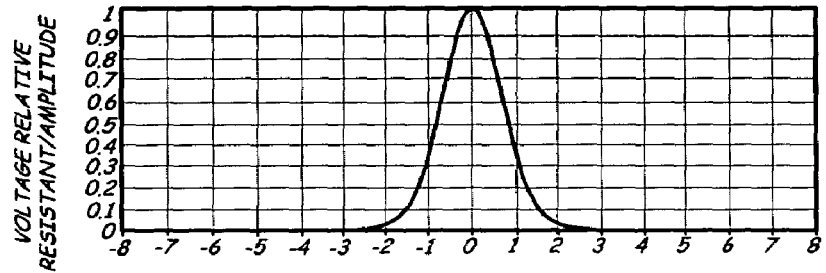
FIG. 8C is a representational graph of a playback waveform generated as the sensor element of FIG. 8A passes over the magnetic medium of FIG. 8B.

FIGS. 8A, 8B and 8C are a series of exemplary drawings illustrating the operation of a naturally differentiated MR sensor element according to the present invention. FIG. 8A shows changes in magnetization directions 34 and 36 of free layers 28 and 30 of a differentiated sensor element in three positions (A, B, and C) as the sensor crosses a single transition of a corresponding magnetic medium (i.e., where the magnetization of localized magnetic fields on the magnetic medium change polarity). Relative magnetization directions 34 and 36 of free layers 28 and 30 shown in FIG. 8A are exemplary. Relative magnetization directions 34 and 36 of respective free layers 28 and 30 in positions A, B and C can have other orientations. Magnetization directions 34 and 36 of free layers 28 and 30 are substantially antiparallel in a quiescent state.

FIG. 8B is an exemplary representation of a portion of a perpendicular magnetic medium exhibiting a single transition in magnetization directions of a series of bits characterized as a first magnetic region 104, a domain wall 106 (i.e., a single transition), and a second magnetic region 108. Magnetization directions of bits on the perpendicular magnetic medium are generally orthogonal to a surface of the magnetic medium, and thus are generally orthogonal to an air bearing surface of a sensor element positioned above the surface of the magnetic storage medium. A differentiated sensor element according to the present invention can be used with a longitudinal magnetic storage medium having bits with magnetization directions generally parallel to a surface of the longitudinal magnetic storage medium. Optimum performance is achieved with perpendicular magnetic recording media.

FIGS. 8A and 8B together illustrate magnetization directions of the free layers of the sensor element in relation to magnetization directions of the bits of the corresponding magnetic medium. At position A, the sensor element is positioned above the interior of first magnetic region 104, which has a constant magnetization direction (i.e., no transition nearby on the magnetic medium) in a first direction. As the sensor element moves relative to the magnetic medium, the sensor element arrives at position B. At position B, the sensor element is positioned directly above a single transition at domain wall 106. At such a transition, the magnetization directions of adjacent bits on the magnetic medium are antiparallel. At position B, the sensor element is above domain wall 106 (i.e., the single transition), and the magnetic field exerted by the magnetic medium upon the sensor element has a net magnitude of approximately zero. Position C, as shown in FIG. 8A, illustrates the sensor element positioned above the interior of second magnetic region 108 (e.g., after the sensor element has passed the single transition at domain wall 106), which has a constant magnetization direction in a second direction.

FIG. 8C is a representational graph of a differentiated playback waveform generated as the sensor element of FIG. 8A crosses a single transition on the magnetic media of FIG. 8B. The graph of FIG. 8C measures relative voltage versus down track position, where position zero corresponds to domain wall 106 at a center of a single transition on a perpendicular magnetic medium. The relative voltage in FIG. 8C is measured over a zero-to-peak range of about 1-2 microvolts ($\mu$V).

In operation, a reader or sensor reads data from the magnetic medium by passing a sense current across free layers 28 and 30 of the sensor element. Because the resistance of the sensor element of the sensor varies as a function of the angle between magnetization directions 34 and 36 of free layers 28 and 30, data from the magnetic medium can be read by dynamically measuring the voltage across the sensor element. This allows detection of transitions on the magnetic medium, which permits data from the magnetic medium to be read. External circuitry, of a type well known in the art, can be used to convert voltage information from the sensor into an appropriate format and to manipulate that information, as necessary, to recover the information encoded on the magnetic medium.

When the sensor element is positioned above a region with no transition nearby, such as at position A (or C), both free layers 28 and 30 of the sensor element will experience a large perpendicular magnetic field. Therefore, an angle between magnetization directions 34 and 36 of each free layer 28 and 30 will be less than 180°, and due to a MR effect, a resistance of the sensor element is relatively low. Then, when the sensor element passes over a single transition on a magnetic medium, such as at position B when the sensor element is above domain wall 106, the perpendicular field component of the magnetic medium (i.e., the magnetization direction of the bits) reverses polarity. When the sensor element approaches the transition at domain wall 106, the localized magnetic field exerted by the magnetic medium upon the sensor element decreases magnitude, and the angle between magnetization directions 34 and 36 of free layers 28 and 30 increases towards 180° (i.e., a substantially antiparallel orientation). When the sensor element is centered above domain wall 106 at position B (i.e., above the single transition), the sensor element is in a quiescent or equilibrium state. In such a quiescent state, there is no perpendicular field component exerted upon the sensor element, magnetization directions 34 and 36 of free layers 28 and 30 are substantially antiparallel, and the resistance of the sensor element achieves a relative peak or maximum value. As the sensor element moves past the single transition at domain wall 106 and toward second magnetic region 108, the magnetic field exerted by the magnetic medium upon the sensor element increases magnitude, and the angle between magnetization directions 34 and 36 of free layers 28 and 30 decreases. Above second magnetic region 108 at position C, both free layers 28 and 30 of the sensor element will experience a large perpendicular magnetic field and the resistance of the sensor element is relatively low.

The playback waveform shown in FIG. 8C reflects relative resistance of the sensor element as the sensor senses the magnetization direction of a series of bits on the magnetic medium. The playback waveform of the curve in FIG. 8C has a minimum voltage when the sensor element is positioned over a portion of the magnetic medium having substantially constant magnetization (i.e., positions A and C in FIG. 8A). The playback waveform of the curve in FIG. 8C has a relative peak or maximum voltage as the sensor element crosses a single transition on the magnetic medium (i.e., position B in FIG. 8B), where the net applied magnetic field has a magnitude of approximately zero and magnetization directions 34 and 36 of free layers 28 and 30 are in a quiescent state.

Thus, as shown in FIG. 8C, the playback waveform for a differentiated sensor element inherently resembles the bell-shaped playback waveform curve found with longitudinal recording when passing a single transition. The peak amplitude of the differentiated playback waveform of a differentiated sensor, including embodiments for perpendicular recording, is comparable to that found with longitudinal recording, such that an overall voltage change of the playback waveform from minimum to maximum (or zero to peak) is, for example, about 1-2 μV.

Figure 9:
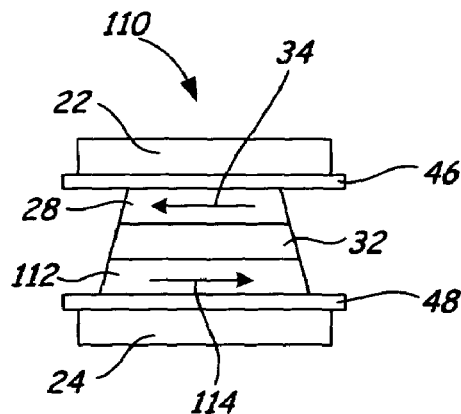
FIG. 9 is an exemplary air bearing surface view of a naturally differentiated current perpendicular-to-plane sensor, which is a portion of a transducing head.

FIG. 9 is an exemplary ABS view of a differentiated current-perpendicular-to-plane (CPP) sensor, which is a portion of a transducer 110. Transducer 110 is illustrated in a quiescent state. Transducer 110 includes leads 22 and 24, spacer layer 32, and inter-layers 46 and 48. Transducer 110 further includes a pair of magnetic layers 28 and 112. Magnetic layer 28 is a free layer, having magnetization direction 34. Magnetic layer 112 is a reference layer having a magnetization direction 114, which is substantially antiparallel to magnetization direction 34 of free layer 28 in a quiescent state.

Magnetization direction 114 of reference layer 112 remains substantially fixed regardless of the presence of external magnetic fields. Magnetization direction 114 of magnetic reference layer 112 can be pinned due to magnetostatic coupling with a pinning layer (not shown) located adjacent magnetic reference layer 112, such as between magnetic reference layer 112 and lead 24, as will be obvious to one skilled in the art.

Magnetization direction 34 rotates according to an external magnetic field, such as localized magnetic fields on a magnetic storage medium (not shown). A resistance of transducer 110 changes as a function of the difference between magnetization directions 34 and 114, where a relative maximum resistance is achieved when the net external magnetic field applied to transducer 110 has a magnitude of zero.

Although the present invention has been described with reference to preferred embodiments, workers skilled in the art will recognize that changes may be made in form and detail without departing from the spirit and scope of the invention.

The invention claimed is:

1. A differentiated sensor comprising:
   a first shield and a second shield separated by the following:
      a pair of non-biased magnetic layers having magnetization directions that are substantially antiparallel in a quiescent state and not antiparallel in a nonquiescent state,
   and the magnetization direction of both non-biased magnetic layers rotate in the nonquiescent state to form an angle between magnetization orientations of less than 180 degrees, wherein at least one of the magnetic layers is a free layer; and
      a spacer layer disposed between the magnetic layers.

2. The differentiated sensor of claim 1, wherein the sensor includes a barrier layer disposed between the pair of magnetic layers.

3. The differentiated sensor of claim 1, wherein the sensor includes a non-magnetic conductive layer disposed between the pair of magnetic layers.

4. The differentiated sensor of claim 1, wherein the sensor does not include a pinned layer.

5. The differentiated sensor of claim 4, further comprising a set layer disposed adjacent one of the free layers.

6. The differentiated sensor of claim 1, further comprising a magnetic coupling layer disposed adjacent one of the free layers for controlling changes in the magnetization direction of that free layer.

7. The differentiated sensor of claim 1, wherein the sensor does not include a permanent magnetic layer.

8. The differentiated sensor of claim 1, further comprising at least one lead for passing current through the magnetic layers.

9. The differentiated sensor of claim 8, wherein a sense current is capable of passing through the magnetic layers, and wherein the sense current is a DC bias current.

10. The differentiated sensor of claim 8, wherein a sense current is capable of passing through the magnetic layers, and wherein the sense current is an AC bias current.

11. The differentiated sensor of claim 8, wherein a sense current is capable of passing through the magnetic layers, and wherein the sense current is a combination of a DC bias current and an AC bias current.

12. A transducer including no more than one sensor element, the sensor element comprising:
  a first shield and a second shield separated by the following:
    two non-biased free layers having substantially antiparallel quiescent magnetization directions and not antiparallel magnetization directions in response to a magnetic field that is perpendicular to the antiparallel magnetization directions and the magnetization direction of both non-biased magnetic layers rotate in the nonquiescent state to form an angle between magnetization orientations of less than 180 degrees, wherein the quiescent magnetization direction of each free layer is substantially determined by the magnetization direction of the other free layer; and
    a spacer layer disposed between the two free layers.

13. The transducer of claim 12, wherein the sensor element does not include a pinned layer.

14. The transducer of claim 12, further comprising a set layer disposed adjacent one of the free layers.

15. The transducing head of claim 12, further comprising a magnetic coupling layer disposed adjacent one of the free layers for controlling changes in the magnetization direction of that free layer.

16. A transducer comprising:
  a first shield and a second shield separated by the following:
    a first non-biased magnetic layer having a first magnetization that rotates in response to an external magnetic field;
    a first lead electrically coupled to the first magnetic layer;
    a second non-biased magnetic layer having a second magnetization that rotates in response to an external magnetic field;
    a second lead electrically coupled to the second magnetic layer; and
    a first spacer layer spaced between and adjacent the first magnetic layer and the second magnetic layer;
    wherein the first magnetization and the second magnetization are substantially antiparallel at equilibrium and not antiparallel in response to an external magnetic field that is perpendicular to the antiparallel magnetization directions and the magnetization direction of both non-biased magnetic layers rotate in the nonquiescent state to form an angle between magnetization orientations of less than 180 degrees.

17. The transducer of claim 16, wherein the spacer layer comprises an oxide.

18. The transducer of claim 16, wherein the spacer layer comprises at least one of copper, silver, gold, and ruthenium.

* * * * *